United States Patent
Anderson et al.

(10) Patent No.: US 7,772,656 B2
(45) Date of Patent: Aug. 10, 2010

(54) COMBINATION PLANAR FET AND FINFET DEVICE

(75) Inventors: Brent Alan Anderson, Jericho, VT (US); Bryant Andres, Burlington, VT (US); William F. Clark, Jr., Essex Junction, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 840 days.

(21) Appl. No.: 11/610,533

(22) Filed: Dec. 14, 2006

(65) Prior Publication Data

US 2008/0142806 A1 Jun. 19, 2008

(51) Int. Cl.
*H01L 27/07* (2006.01)
*H01L 27/088* (2006.01)
*H01L 29/78* (2006.01)

(52) U.S. Cl. .............................. 257/392; 257/E27.029; 257/E29.264

(58) Field of Classification Search .................. 257/328, 257/329, 330, 331, 332, 341, 350, 351, 368, 257/369, 390, 391, 392, 618, 619, E25.01, 257/E25.011, E25.012, E25.013, E25.024, 257/E25.025, E25.026, E25.029, E27.028, 257/E27.029, E29.169, E29.226, E29.242, 257/E29.255, E29.264
See application file for complete search history.

(56) References Cited

U.S. PATENT DOCUMENTS

| 6,229,342 | B1 | 5/2001 | Noble et al. |
| 6,800,905 | B2 | 10/2004 | Fried et al. |
| 7,084,461 | B2 * | 8/2006 | Anderson et al. ........... 257/347 |
| 2004/0266076 | A1 | 12/2004 | Doris et al. |
| 2005/0156202 | A1 | 7/2005 | Rhee et al. |

FOREIGN PATENT DOCUMENTS

JP          2005101515          4/2005

* cited by examiner

*Primary Examiner*—Lynne A Gurley
*Assistant Examiner*—Andrew O Arena
(74) *Attorney, Agent, or Firm*—Schmeiser, Olsen & Watts; Richard M. Kotulak

(57) ABSTRACT

A semiconductor device. The device including: a planar FET formed in a single crystal-silicon substrate, the FET comprising a first channel region, first and second source drains on opposite sides of the first channel region and a gate, the gate over the channel region and electrically isolated from the channel region by a first gate dielectric layer; and a FinFET formed in single crystal silicon block on top of and electrically isolated from the substrate, the FinFET comprising a second channel region, third and fourth source drains on opposite first and second ends of a second channel region and the gate, the gate electrically isolated from the second channel region by a second gate dielectric layer.

7 Claims, 3 Drawing Sheets

COMBINATION PLANAR FET AND FINFET DEVICE

FIELD OF THE INVENTION

The present invention relates to the field of integrated circuit devices; more specifically, it relates to a combined planar FET and FinFET device.

BACKGROUND OF THE INVENTION

The semiconductor industry is characterized by ever decreasing transistor sizes and increased transistor density. In addition to conventional planar FETs, FinFETs have been developed. However, combining planar FETs with FinFETs has resulted in many cases, in decreased device density rather than increased device density. Therefore, there is a need to combine planar FETs and FinFETs in denser structures.

SUMMARY OF THE INVENTION

A first aspect of the present invention is a device, comprising: a planar FET formed in a single crystal-silicon substrate, the FET comprising a first channel region, first and second source drains on opposite sides of the first channel region and a gate, the gate over the channel region and electrically isolated from the channel region by a first gate dielectric layer; and a FinFET formed in single crystal silicon block on top of and electrically isolated from the substrate, the FinFET comprising a second channel region, third and fourth source drains on opposite first and second ends of a second channel region and the gate, the gate electrically isolated from the second channel region by a second gate dielectric layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A planar FET is defined as an FET having source/drains and a channel region formed in a bulk semiconductor substrate or in a silicon layer of a silicon on insulator substrate. Top surfaces of the source/drains and channel region are substantially co-planar with the top surface of the substrate or silicon layer, though top surfaces of the source/drains may be recessed slightly below the top surface of the substrate and channel regions. The source drains are formed on either side of and abut the channel region. The source/drains and channel region do not extend above the top surface of the substrate. A gate is formed over the channel region and electrically isolated from the channel region by a gate dielectric. A second gate dielectric and a second gate may also be formed in the substrate and under the channel region in a dual gated planar FET.

A FinFET is defined as a an FET formed in a block of semiconductor material having opposite ends, a top surface opposite a bottom surface contacting a top surface of a substrate and a first sidewall and opposite second sidewall, where the source/drains are formed adjacent to the ends of the block with the channel region between and abutting the source/drains and the gate is formed over a gate dielectric on the first sidewall, the, second sidewall, the top surface or combinations thereof.

Figure 1:
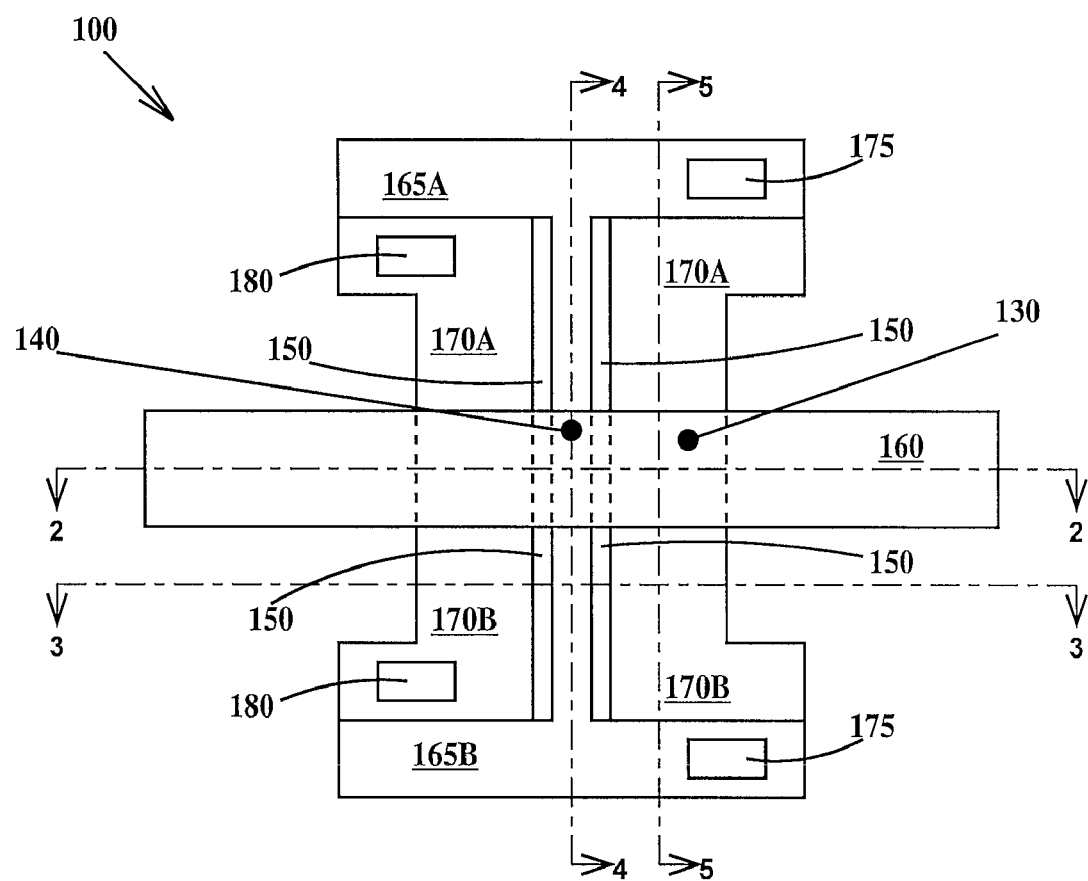
FIG. 1 a top view of combination FET and FinFET device according to embodiments of the present invention.
Figure 2:
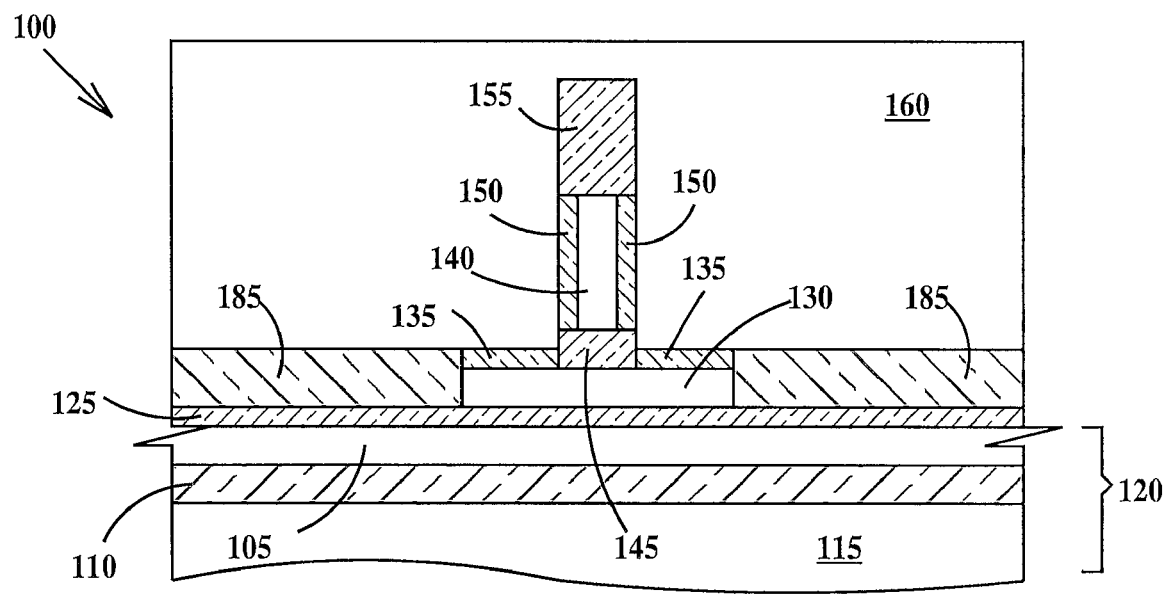
FIG. 2 is a cross-section through line 2-2 of FIG. 1.

FIG. 1 a top view of a combination FET (field effect transistor) and FinFET device according to embodiments of the present invention and FIG. 2 is a cross-section through line 2-2 of FIG. 1. In FIGS. 1 and 2, a device 100 includes a single-crystal silicon planar FET back gate 105 on top of a buried oxide layer (BOX) 110 on top of a base substrate 115 of a silicon-on-insulator (SOI) substrate 120, a planar FET back gate dielectric layer 125 on top of planar FET back gate 105, a single-crystal planar FET channel region 130 on top of back gate dielectric layer 125, a planar FET top gate dielectric layer 135 on top of planer FET channel region 130, a single-crystal silicon FinFET channel region 140 over planar FET channel region 130 and separated from planar FET channel region 130 by an insulator 145, a FinFET gate dielectric layer 150 on opposite sidewalls of FinFET channel region 140, an optional capping insulator 155 on top of FinFET channel region 140, and a planar FET top gate/FinFET dual gate combination gate 160 in direct physical contact with said planar FET top gate dielectric layer 135 on top of planar FET channel region 130 and in direct physical contact with the FinFET gate dielectric layer 150 on the sidewalls of FinFET channel region 140. Planer FET channel region 130, first planar FET source/drain region 165A and second planar FET source/drain region 165B, are bounded by a shallow trench isolation (STI) 185.

Device 100 further includes, a first FinFET source/drain region 165A abutting a first side of FinFET channel region 140, a second FinFET source/drain region 165B abutting a second and opposite side of FinFET channel region 140, a first planar FET source/drain region 170A abutting a first side of planar FET channel region 130, and a second planar FET source/drain region 170B abutting a second and opposite side of planar FET channel region 130. Planar FET source/drain contacts 175 and FinFET source/drain contacts 180 are also illustrated in FIG. 1.

Thus, a planar FET device portion of device 100 includes planar FET back gate 105, planar FET back gate dielectric layer 125, planar FET channel region 130, planar FET top gate dielectric layer 135, planar FET top gate/FinFET dual gate combination gate 160, first planar FET source/drain region 170A, second planar FET source/drain region 170B and planar FET source/drain contacts 175.

Thus, a FinFET device portion of device 100 includes FinFET channel region 140, FinFET gate dielectric layer 150, planar FET top gate/FinFET dual gate combination gate 160, first FinFET source/drain region 165A, second FinFET source/drain region 165B and FinFET source/drain contacts 180. In one example both the FinFET device portion and the FET device portion of device 100 are fully depleted devices (e.g. when turned on the depletion zone of the extends throughout the channel region of the device).

A top surface of SOI substrate 120 defines a horizontal direction. The planar FET device portion of device 100 extends in the horizontal direction. The FinFET device portion of device 100 extends vertically above the planar FET device portion. The channel and source/drain regions of the planar FET and FinFET form an inverted "T."

In FIG. 2, if gate dielectric does not extend above dielectric cap 155 or FinFET channel region 140, then the FinFET device portion of device 100 will be dual gated. If capping layer 155 is not present, then FinFET gate dielectric layer 150 will also be formed on the top surface of FinFET channel region 140.

In one example, a crystal orientation of FinFET channel region 140 is [1 0 0] in the direction perpendicular to carrier flow and a crystal orientation of planar FET channel region 130 is [1 1 0] in the direction perpendicular to carrier flow.

In one example, the planar FET device portion of device 100 is an N-channel FET (NFET) and the FinFET device portion of device 100 is a P channel FET (PFET.) In one example, the planar FET device portion of device 100 is a PFET and the FinFET device portion of device 100 is an NFET. In one example, both the planar FET device portion of device 100 and the FinFET device portion of device 100 are PFETs. In one example, both the planar FET device portion of device 100 and the FinFET device portion of device 100 are NFETs.

In one example the planar FET device portion of device 100 is a fully depleted PFET and planar FET channel region 130 has a [1 1 0] crystal orientation in the direction perpendicular to carrier flow and the FinFET device portion of device 100 is a fully depleted NFET and FinFET channel region 140 is has a crystal orientation of [1 0 0] in the direction perpendicular to carrier flow.

Figure 3:
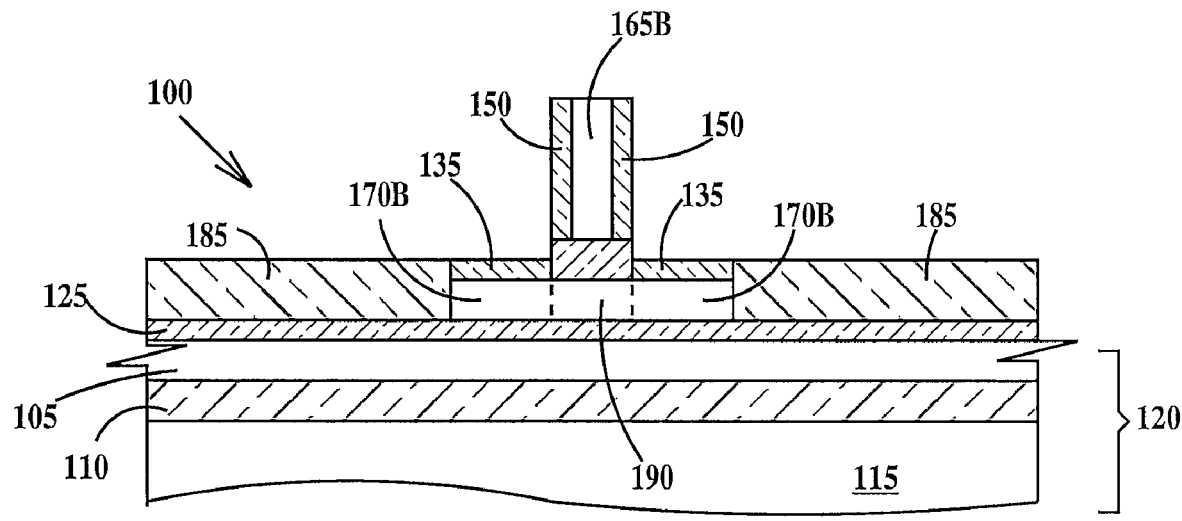
FIG. 3 is a cross-section through line 3-3 of FIG. 1.

FIG. 3 is a cross-section through line 3-3 of FIG. 1. In FIG. 3, it is illustrated that region 190 of second planar FET source/drain region 170B (there is also a corresponding region of second planar FET source/drain region 170B, not shown in FIG. 3) is either undoped or doped differently from second planar FET source/drain region 170B.

Figure 4:
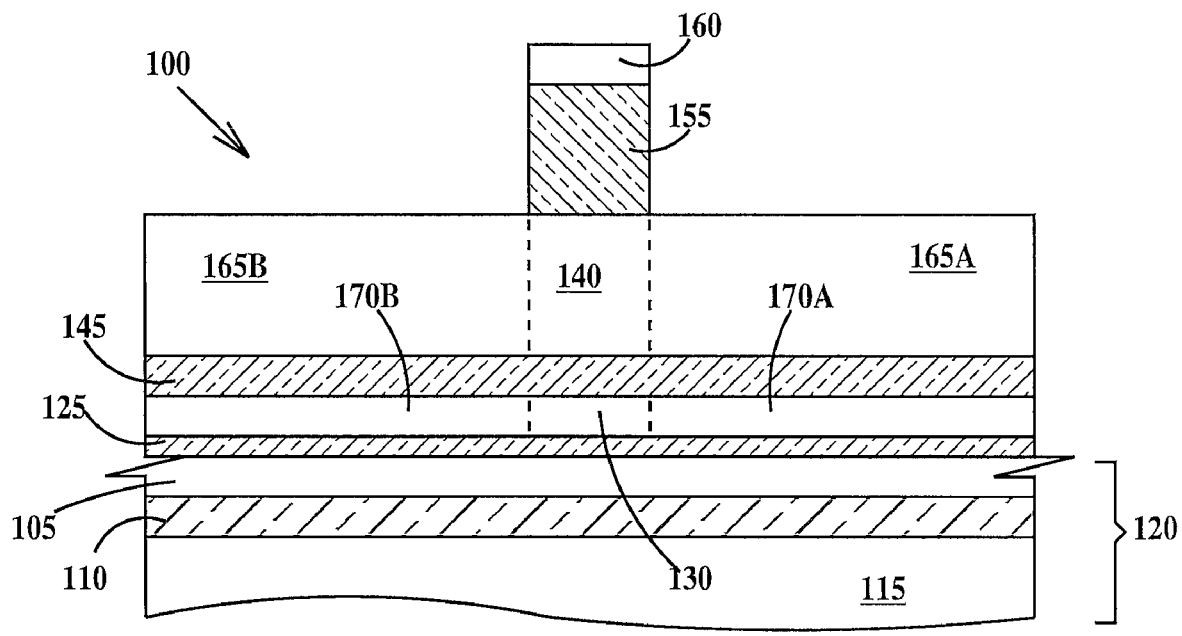
FIG. 4 is a cross-section through line 4-4 of FIG. 1.
Figure 5:
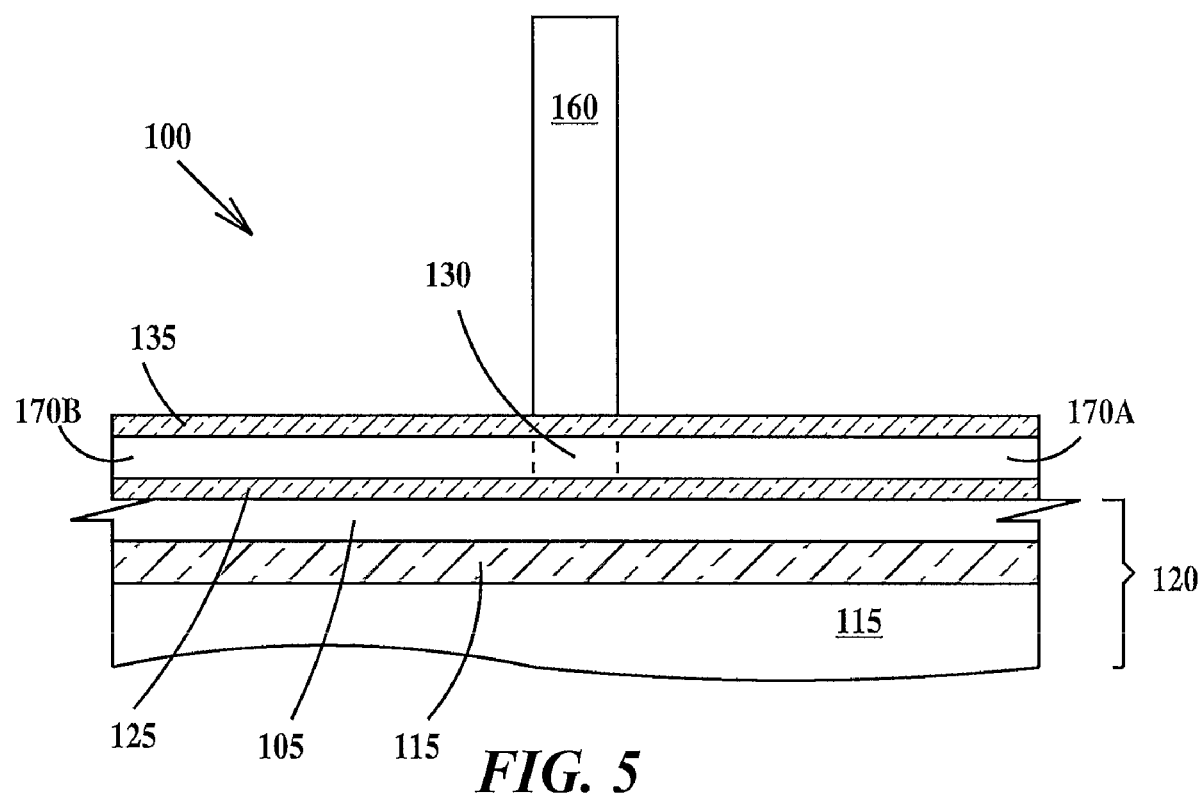
FIG. 5 is a cross-section through line 5-5 of FIG. 5.

FIG. 4 is a cross-section through line 4-4 of FIG. 1 and FIG. 5 is a cross-section through line 5-5 of FIG. 5. FIG. 4 is a cross-section through the fin of the FinFET device portion of device 100 and FIG. 5 is a cross-section in the same direction as section 4-4 of FIG. 4, but off the fin.

Thus the embodiments of the present invention provide planar FETs and FinFETs in a very dense structure.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A device, comprising:
   a first single-crystal silicon layer separated from a base substrate by a buried oxide layer, a top surface of said buried oxide layer on a top surface of said substrate, a top surface of said first single crystal silicon layer on a top surface of said buried oxide layer;
   a first gate dielectric layer on a top surface of said a first single-crystal silicon layer;
   a second single-crystal silicon layer on a top surface of said first gate dielectric layer;
   a second gate dielectric layer on a top surface of said second single-crystal silicon layer;
   a single-crystal silicon fin formed on a top surface of said third gate dielectric layer;
   third and fourth gate dielectric layers formed on sidewalls of said single-crystal silicon fin;
   a dielectric cap formed on a top surface of said single-crystal silicon fin;
   a polysilicon gate on said second, third and fourth gate dielectric layers;
   a planar FET, said FET comprising a first channel region in said second single-crystal silicon layer under said polysilicon gate, first and second source/drains on opposite sides of said first channel region, said first and second gate dielectric layers, said first single-crystal silicon layer being a back gate of said planar FET, said polysilicon gate being a top gate of said planar FET; and
   a FinFET, said FinFET comprising a second channel region in said single-crystal-silicon fin, said third and fourth gate dielectric layers, third and fourth source/drains in said single-crystal silicon fin on opposite first and second ends of said second channel region, said polysilicon gate also being a gate of said FinFET.

2. The device of claim 1, wherein said second channel region overlaps said first channel region to form an inverted "T" and is isolated from said first channel region by an insulator formed between and abutting both said second single-crystal silicon layer and said single-crystal silicon fin, said insulator between regions of said second gate dielectric layer, said insulator thicker than said second gate dielectric layer.

3. The device of claim 1, further including a first contact to said first source/drain, a second contact to said second source/drain, a third contact to said third source/drain and a fourth contact to said fourth source/drain, said first, second, third and fourth source/drains electrically isolated from each other.

4. The device of claim 1, wherein a first crystal orientation of said first and second source/drains and said first channel region is different from a second crystal orientation of said third and fourth source/drains and said second channel region.

5. The device of claim 1, wherein said FinFET and said planar FET are fully depleted devices.

6. The device of claim 1, wherein said planar FET is a fully depleted PFET and first channel region has a [1 1 0] crystal orientation in the direction perpendicular to carrier flow and said FinFET is a fully depleted NFET and said second channel region has a crystal orientation perpendicular to [1 0 0] in the direction of carrier flow.

7. The device of claim 1, further including:
   a shallow trench isolation bounding said second single-crystal silicon layer, a top surface of said shallow trench isolation coplanar with said top surface of said second single-crystal silicon layer, said shallow trench isolation extending toward said substrate to abut said top surface of said first gate dielectric layer.

* * * * *